United States Patent [19]
Dyck

[11] Patent Number: 5,754,228
[45] Date of Patent: May 19, 1998

[54] RAPID-SEQUENCE FULL-FRAME CCD SENSOR

[75] Inventor: Rudolph H. Dyck, Palo Alto, Calif.

[73] Assignee: Lockhead Martin Corporation, Milpitas, Calif.

[21] Appl. No.: 533,069

[22] Filed: Sep. 25, 1995

[51] Int. Cl.$^6$ .............................. H04N 3/14; H01L 24/148
[52] U.S. Cl. .......................... 348/266; 348/268; 257/228
[58] Field of Search ........................ 348/266, 267, 348/268, 269, 311; 257/228; 358/512, 513

[56] References Cited

U.S. PATENT DOCUMENTS

| | | | |
|---|---|---|---|
| 3,777,061 | 12/1973 | Takemura | 178/5.4 R |
| 4,535,363 | 8/1985 | Harada et al. | 358/213 |
| 4,604,652 | 8/1986 | Elabd et al. | 348/266 |
| 4,760,451 | 7/1988 | Grenier et al. | 358/213.13 |
| 4,774,557 | 9/1988 | Kosonocky | 257/228 |
| 4,821,103 | 4/1989 | Busby | 358/213.26 |
| 4,831,453 | 5/1989 | Takemura | 358/213.19 |
| 4,837,630 | 6/1989 | Ueda | 358/213.26 |
| 4,928,180 | 5/1990 | Knibbe | 358/213.13 |
| 4,989,075 | 1/1991 | Ito | 348/266 |
| 4,999,717 | 3/1991 | Nagashima | 358/448 |
| 5,101,266 | 3/1992 | Schlig et al. | 358/75 |
| 5,406,331 | 4/1995 | Barrett | 348/268 |
| 5,497,195 | 3/1996 | Sayag | 348/266 |

*Primary Examiner*—Wendy Garber
*Attorney, Agent, or Firm*—Perman & Green, LLP

[57] ABSTRACT

A CCD sensor structure adapted for backside illumination, has a wide depletion layer separating the illuminated surface from potential barrier-like structures, e.g., in the form of a series of p-wells, that shield portions of the CCD channels and that cause the photoelectrons to converge through "ports" between the p-wells into selected regions of the CCD channels. The potential barriers are thus arrayed to delineate at the CCD surface a series of charge-packet-forming or integrating regions, each of which has two (or more) adjacent shielded charge-packet-holding or storage regions into which the frame-indicative charge packets are successively shifted upon receipt of the light from successive image frames. With an anti-reflective coating on the illuminated back surface, this device not only provides 100% fill-factor for each of the successive frames, but also can provide very high quantum efficiency (QE) across the visible spectrum. A preferred embodiment utilizes 7-phase (non-barrier-type) ripple clocking for charge packet readout.

22 Claims, 6 Drawing Sheets

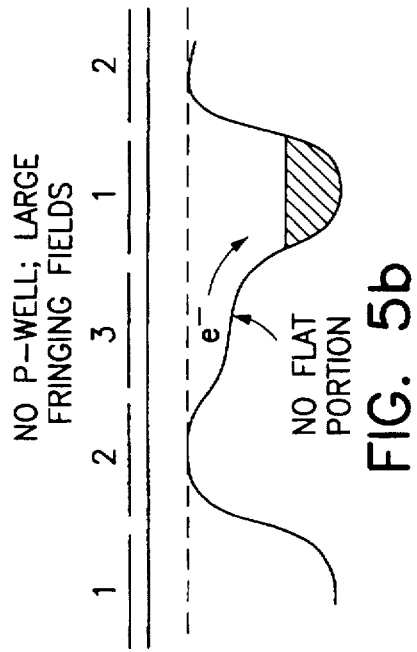
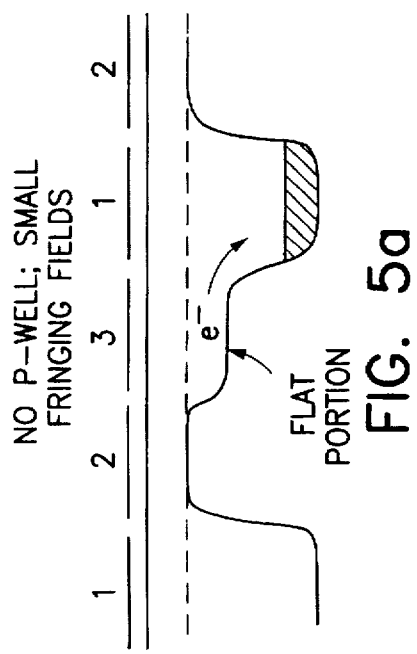
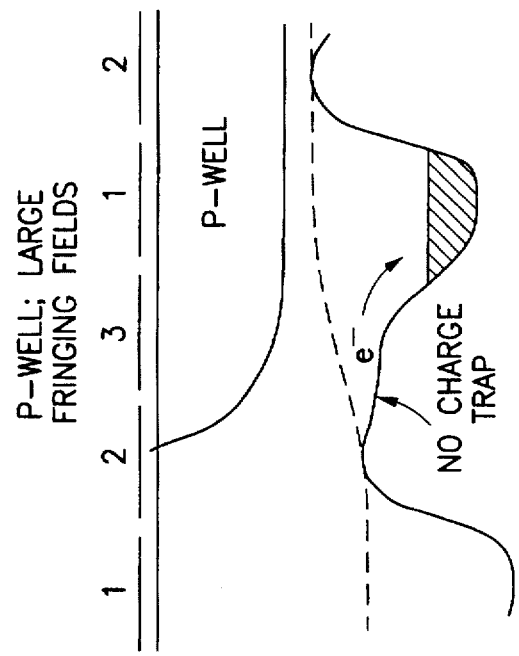
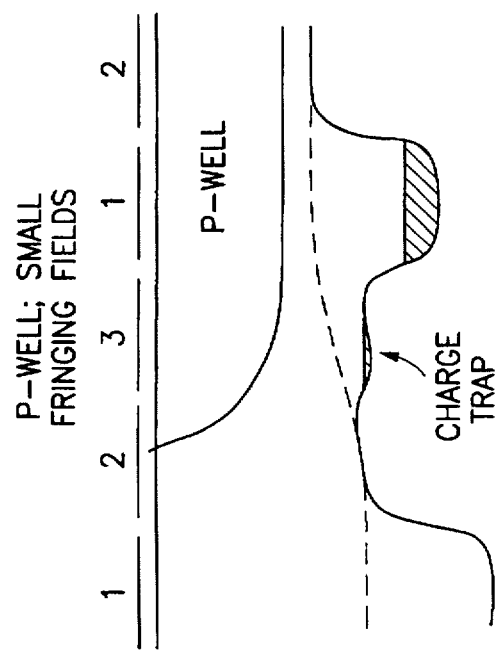

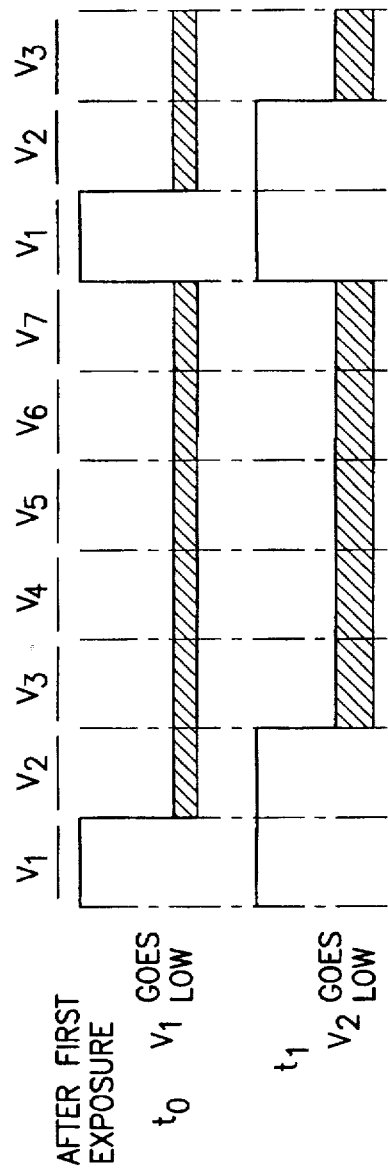

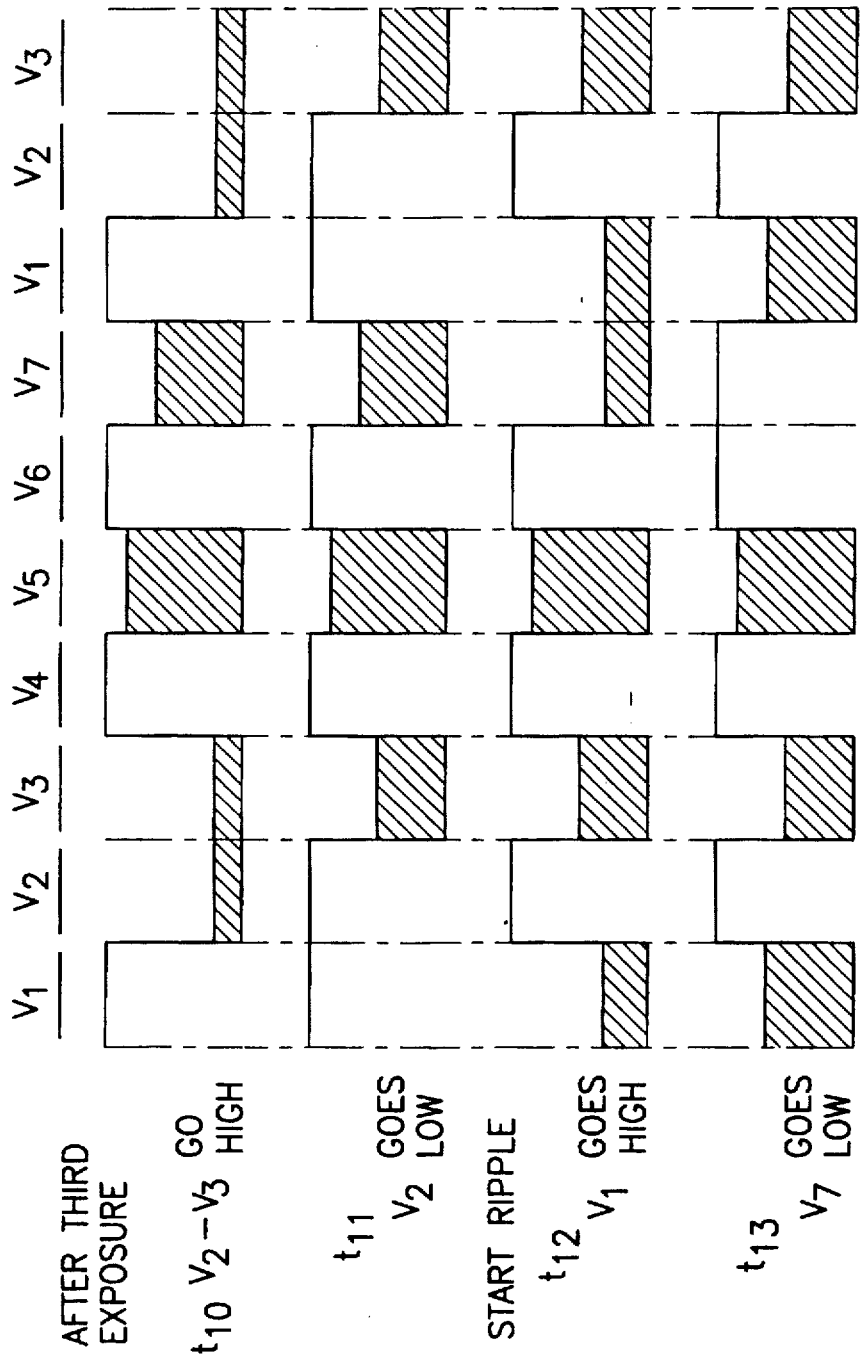

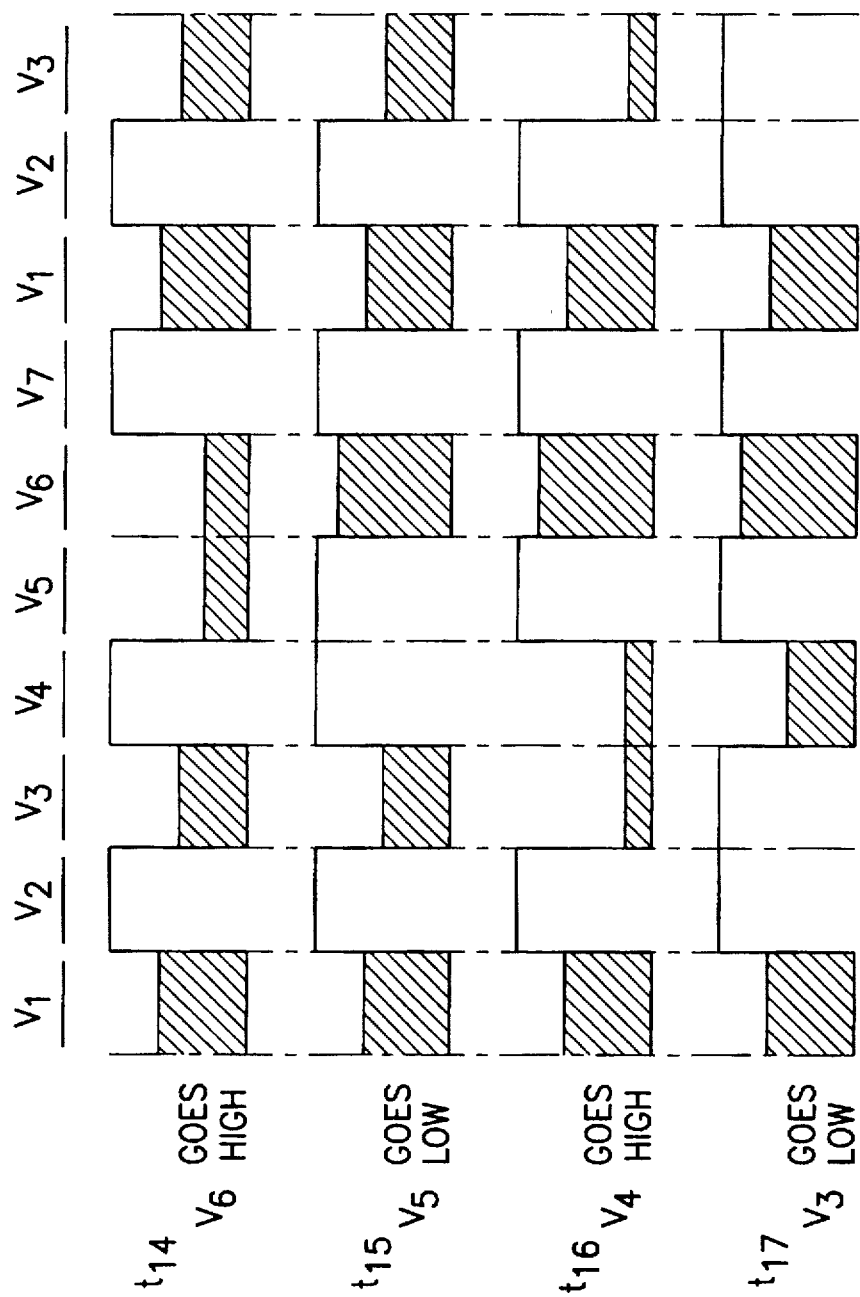

RAPID-SEQUENCE FULL-FRAME CCD SENSOR

RELATED APPLICATIONS

The subject matter of this application is related to that disclosed in commonly-assigned, U.S. patent application Ser. No. 07/994,875, filed 23 Dec. 1992, and a continuation-in-part thereof Ser. No. 08/314,599, filed 28 Sep. 1994.

BACKGROUND OF THE INVENTION

1. Field of the Invention:

The present invention relates to CCD sensors and more particularly to a CCD sensor device with a very-high-resolution array suitable for monochrome and color imaging.

2. Prior Art:

Various schemes and structures are known for creating multi-color electronic images using CCD technology. A common arrangement involves the disposition of arrays having photosensitive sections for gathering charge carriers and adjacent storage sections into which the charge packets may be shifted prior to being read out. Examples of such devices are disclosed in U.S. Pat. Nos. 3,777,601 and 4,831,453 to Y. TAKEMURA, and 4,821,103 to P. BUSBY, and 4,837,630 to K. UEDA. Successive shifting prior to readout is shown in U.S. Pat. No. 4,760,451 to G. GRENIER ET AL which discloses a CCD electro-optical sensor array in which a line of optical information is stored in a photosensitive area of the array, then shifted to a memory line, and then is shifted to a third line from which the information is read, and in U.S. Pat. No. 5,101,266 to E. SCHLIG ET AL which provides a first line of optical sensing elements associated with two lines of masked charge transfer elements, to which the charges accumulated on the sensing line are transferred in sequence. All of these teachings involve various clocking systems for manipulating the charge packets to appropriately shift them and read them out.

While the above-cited and other such CCD systems of the prior art have many and different features and advantages, they also have a number of weaknesses and disadvantages in terms of fill factors, quantum efficiency, charge packet mixing, image blooming, signal-to-noise ratios, charge storage area, and the like.

3. Objects:

It is an object of the present invention to provide a CCD image sensor and clocking system that significantly reduces and eliminates many of the disadvantages found in prior art systems.

SUMMARY OF THE INVENTION

The present invention involves a backside-illuminated CCD image sensor that is capable of: collecting charge packets, produced by the photoelectrons from a first frame of an image in selected regions of the CCD imaging surface, and rapidly shifting these frame-indicative charge packets into adjacent surface regions shielded from the direct entry of photoelectrons; then, collecting charge packets indicative of a second frame of the image and again rapidly shifting these charge packets into the adjacent surface regions shielded from photoelectrons; and then, collecting charge packets from a third frame and, after closing an image-passing shutter in the optical path, scanning all the collected charge packets to a charge-sense amplifier that generates a voltage output signal, corresponding to the sizes of the charge packets and indicative of the three frames. The sensor may operate in this manner in conjunction with a three-color sequential filter means in the optical path and provide a color image wherein each color of the image has a 100% fill-factor and yet there is no mixing of the three sets of charge packets.

The invention is embodied in a CCD sensor structure adapted for backside illumination, which has a wide depletion layer separating the illuminated surface from the surface of the CCD channels with potential barrier-like structures or electric field shaping regions adjacent the CCD channels, e.g., in the form of a series of "p-wells", i.e., regions having deep p-type diffusions, whereby photoelectrons that drift from the illuminated surface are deflected from the p-wells and toward the openings between them. The function of the p-wells may be described as shaping the iso-potential lines in the depletion layer so as to draw the photoelectrons away from the p-wells and toward the openings between them. The p-wells, accordingly, create an electric field shaped to shield portions of the CCD channels and to cause the photoelectrons to converge through "ports" between the p-wells into selected regions of the CCD channels. These potential barrier-like structures are thus arrayed to delineate in the CCD surface a series of charge-packet-forming or integrating regions, each of which has two (or more) associated and approximately adjacent charge-packet-holding or storage regions into which the frame-indicative charge packets are successively shifted upon receipt of the light from successive image frames. With an anti-reflective coating on the illuminated back surface, this device not only provides 100% fill-factor for each of the successive frames, but also can provide very high quantum efficiency (QE) across the visible spectrum.

One embodiment of the invention in the form of a high-performance sequential-color still-picture CCD sensor includes such features as:

1) back-illumination, e.g., using 1–3 Kohm-cm MCZ silicon to give a depletion depth of 30–50 μm, and thinning just to the edge of the depletion volume;

2) p-well diffusion barriers between the illuminated surface and the regions of the CCD channels where the first and second-frame charge packets are to be stored, so as to adapt the full area of the CCD surface to be sensitive and yet not allow the charge packets to mix (this can greatly improve signal-to-noise ratios (SNRs), and the backside illumination can give QE's of close to 100% over the visible spectrum); and 3) a 7-phase (non-barrier-type), or a 4-phase (barrier-type), ripple clocking CCD design.

BRIEF DESCRIPTION OF THE DRAWINGS

FIGS. 5a–5d show a series of potential diagrams illustrating how fringing fields can eliminate charge trapping at the back portion of a CCD well caused by a p-well. FIG. 5a illustrates the existence of a flat potential portion in a semiconductor with no p-well and small fringing fields. FIG.

5b shows the change in the profile of FIG. 5a due to the presence of large fringing fields wherein the flat portion becomes rounded or inclined facilitating the collection of all the charge at the next electrode. FIG. 5c illustrates the potential profile when a p-well is present and the fringing fields are small. FIG. 5d shows the change in the profile of FIG. 5c with large fringing fields.

FIGS. 6a–6n illustrate an example of a preferred clocking scheme involving 7-phase ripple clocking in accordance with the invention.

DETAILED DESCRIPTION OF THE PREFERRED EMBODIMENT

Figure 1:
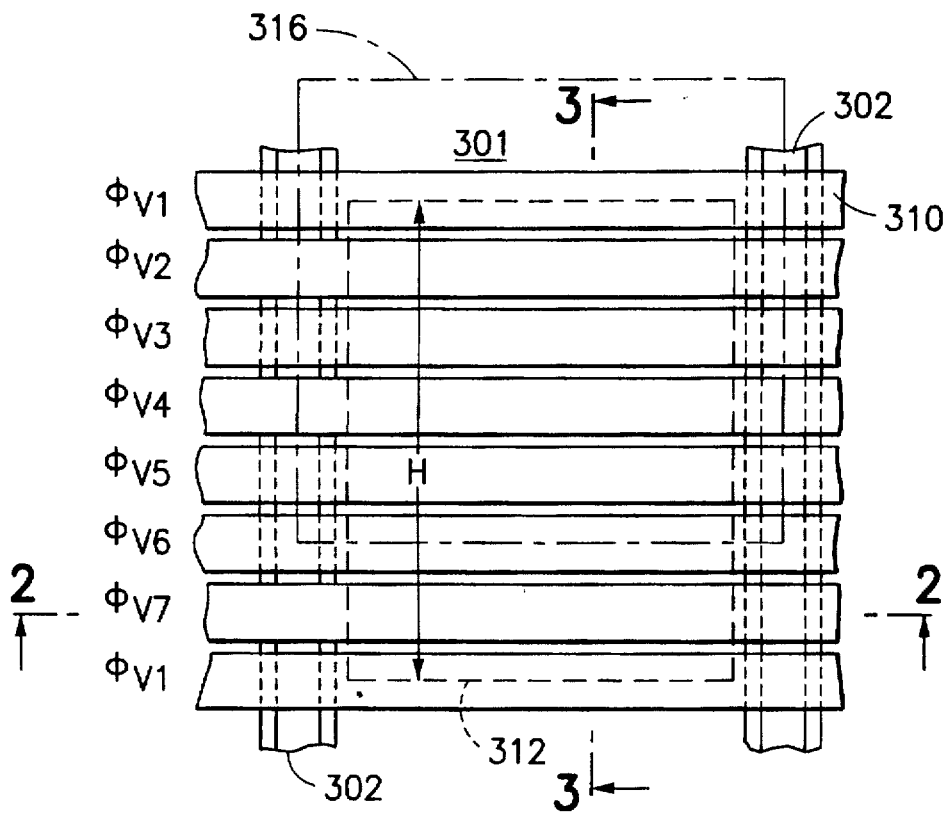
FIG. 1 is a front view of a portion of a CCD sensor in accordance with the invention illustrating the photoelectron collecting area for one pixel.

FIG. 1 shows a CCD surface area and control electrode arrangement for a preferred embodiment of a CCD sensor in accordance with the invention. The portion of surface area shown is formed of a CCD charge flow channel 301, that is defined laterally by channel stops or by boundary channels 302 which can act as overflow drains, and that has an overlayer of gate electrodes 310 arrayed along the channel 301. The photoelectron collecting area 316 for one pixel of the image being sensed, is indicated by the dotted lines in the boundary channels 302, which define the outer edges, and the cross-wise lines defining the upper and lower edges. The dotted line enclosure 312 indicates the CCD charge manipulating area or cell for one such pixel. The array of gate electrodes 310 are provided with seven phases of input voltages $\phi_{V1}-\phi_{V7}$ for manipulating the charge packets collected in a manner as will be described.

Figure 2:
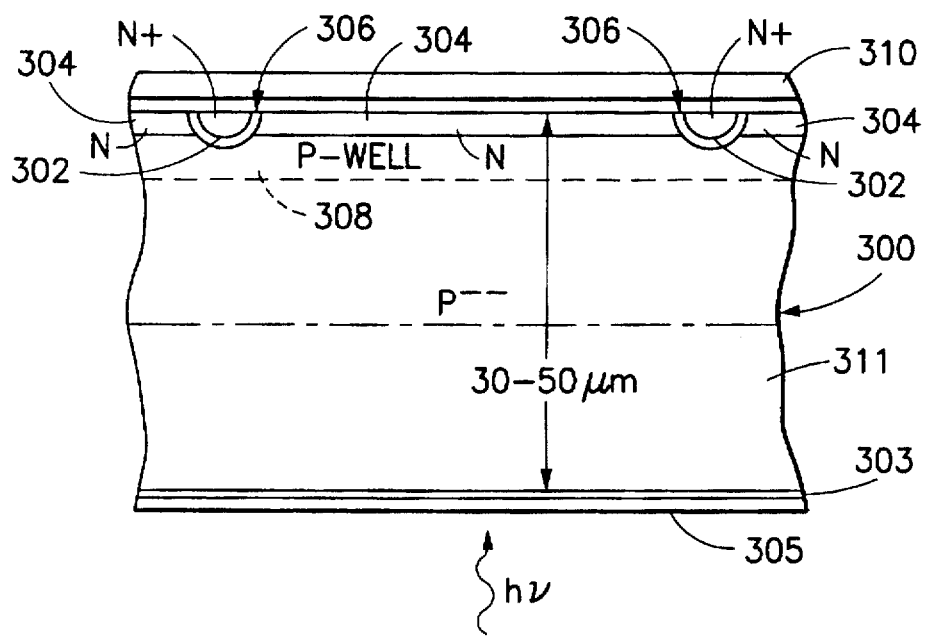
FIG. 2 is a bottom view in section of the portion of the CCD sensor shown in FIG. 1.

As seen in FIG. 2, the device is back illuminated and preferably is formed from a silicon wafer that may be of approximately 1–3 Kohm-cm, e.g., 1500 ohm-cm, p-type MCZ silicon, although materials of a wide range of resistivities both lower and higher than this value may be found feasible in some applications of the invention. The wafer may have a thickness of anywhere from 30 to 50 µm. This allows for the possibility of a depletion layer 300 that is approximately 30 µm deep. It is desirable to have a final silicon thickness of at least 30 µm thickness, primarily because this will minimize the chance of breakage during manufacture. A CCD layer or structure 304 is formed on the side of the wafer opposite the illuminated p$^+$ surface layer 303 and a potential barrier-like structure 308 is disposed between them, adjacent the CCD layer 304. Structure 308 is one of an array of potential barrier-like structures disposed along the CCD structure, which array may be formed as a series of p-wells (see FIG. 3) that produce a barrier-like potential profile to divert photoelectrons to selected regions along the CCD channel 301, which regions are in alignment with the array of gate electrodes 310. The nominal doping levels in the p-wells can be of the order of 5 to 20 times higher than in the surrounding p-type silicon. For example, if the surrounding silicon is 2.0 K-ohm-cm, corresponding to a doping level of $7e^{12}/cm^3$, then the nominal p-well doping level would be approximately in the range of from $3.5e^{13}$ to $1.4e^{14}/cm^3$. The modification of these and certain other parameters, as compared with those of prior art CCDs, to form the deep depletion layers with the proper shape of electric field, will be within the purview of those of skill in the art given the present description.

It will be seen that the principal region 311 of electro-optical excitation, which may be about 3 µm thick, is some distance from the active CCD surface structure 304 and the potential barrier-like structures or p-wells 308. This is desirable because a high-performance design allows only a very small fraction of the light to penetrate the p-wells provided adjacent to the active structure, which light could produce an error signal. Since silicon has a very high refractive index in the blue band, the electro-optical excitation region is preferably provided with an anti-reflective (AR) coating 305, which in this embodiment is an optimum quarter-wave coating for a wavelength near 450 nm. Very high blue sensitivity offers a major advantage since the quantum efficiency (QE) in the blue band could be above 80%, and the fill-factor is 100%. Also, for anti-blooming purposes, the lateral overflow drains 302 are preferably of the double-diffused type where their barrier p-region 306 is approximately 0.5 µm wide.

Figure 3:
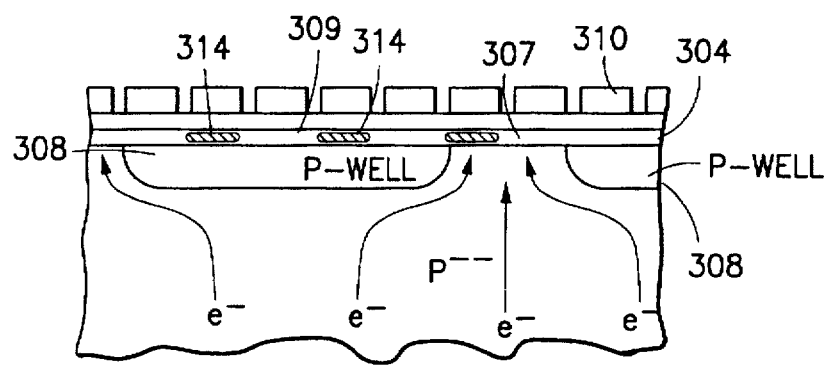
FIG. 3 is a side view in section of the portion of the CCD sensor shown in FIG. 1.

Reference to FIG. 3 will show that the wide depletion layer 300 accommodates the passage of photoelectrons, e$^-$, resulting from the backside illumination, from the illuminated surface 303 to the potential barrier-like structures 308, or p-wells. The p-wells 308, in producing the barrier-like potential profile, act to shield portions of the CCD channels from the direct entry of photoelectrons and cause the photoelectrons to converge between them into selected regions of the CCD channels. In accordance with the invention, the p-wells 308 are selectively arrayed to define a series of regions 307 in the CCD channels, wherein charge packets 314 are formed, and two (or more) shielded charge-packet-holding regions 309, associated with and approximately adjacent to each charge-packet-forming region 307, into which the charge packets 314 from the adjacent charge-packet-forming region are successively shifted upon receipt of the light from successive image frames. As seen in FIG. 3, for a three-frame sequence, the p-wells 308 serve to divert the photoelectrons, e$^-$, from successive exposures away from the two shielded charge-packet-holding regions 309, so that the charge packets 314 formed during the first two frames of the three-frame sequence can be shifted into and stored in these regions. The boundaries of the p-wells 308 are formed so as to align with the edges of gate regions defined by gate electrodes 310. This results in the least excess gate bias being required to overcome the effect of the repulsive field as the charge packets 314 enter the channel region inside a p-well 308.

If the gates are on 3 µm centers, as is common in current CCD image sensors with very high resolution, the height "H" of the unit cell 312 (FIG. 1), within which the series of charge packets 314 for a single "pixel" are stored, would be 21 µm. A "pixel" in this embodiment comprises the area 316 of a CCD channel surface which gathers charge carriers for a specific unit cell 312. If a square pixel is desired, the channel stops and/or antiblooming structures 302 can also be on 21 µm centers. The gate electrodes 310 are shown schematically, their actual form being familiar to those of skill in the art. They can be made with a 2-layer polysilicon process or a 3-layer polysilicon process or they can be made with a refractory metal silicide.

By way of a brief description of the operation, light, hv, from an image to be sensed by the CCD array impinges on the surface 303 of the wafer opposite that on which the gate electrodes 310 are formed. The light photons produce photoelectrons, e$^-$, in the optical excitation region of the wafer, which photoelectrons are drawn to the CCD region 304 and produce charge packets 314 therein. The impinging light is controlled by a suitable shutter and filter system, such as shutter 410 and rotatable color filter 411 shown in FIG. 4, disposed in the optical path from the source, which system divides the image into a series of image frames of different colors, typically red, green, and blue. An electrically switchable color filter may also be used for this purpose.

The present CCD image sensor, preferably using the clocking phases, $\phi_{V1}-\phi_{V7}$, for manipulating the electric fields beneath the gate electrodes 310 to move charge packets along the CCD channels, performs the successive imaging steps of: opening the shutter and collecting charge packets 314 from charge carriers produced by a first frame in one color; rapidly shifting these charge packets into adjacent spaces 309, behind p-wells 308, protected from exposure to photoelectrons; collecting charge packets from a second frame of a different color; again rapidly shifting these charge packets into the adjacent spaces 309 protected from photoelectrons; collecting charge packets from a third frame of a third color; and then, after closing the shutter, scanning all the collected charge packets, via one CCD output region, to a charge-sense amplifier that generates a voltage output signal corresponding to the sizes of the charge packets from the three frames of imagery, the rows of charge packets being interleaved in line-sequential arrangement.

Figure 4:
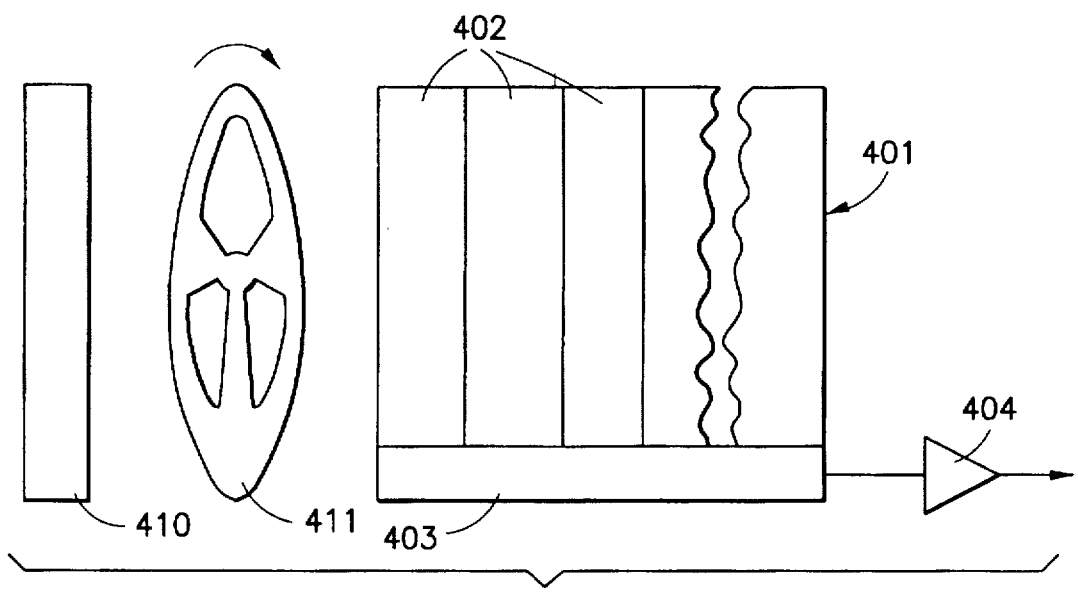
FIG. 4 illustrates an example of a sensor device arrangement for forming and scanning collected charge packets to a charge-sense amplifier output.

A simple example of a suitable sensor device arrangement for forming and scanning the collected charge packets to a charge-sense amplifier is shown in FIG. 4. The sensor device 401 has a full-frame (FF) organization which is used to store the charge packets for the three colors. In the device 401, an array of vertical CCD registers 402, containing charge packets from successive exposures, transfer the charge packets in parallel into a horizontal storage register 403 from which they are readout through a charge-sensing preamplifier 404 that generates a voltage output signal corresponding to the sizes of the charge packets.

The sensor may operate in this manner in conjunction with a three-color sequential filter device, e.g., rotatable filter 411, in the optical path of the image and provide a sequential color image wherein each color has a 100% fill-factor and yet there is no mixing of the three sets of charge packets. With the addition of the anti-reflective coating 305 on the illuminated surface 303, this device not only provides 100% fill-factor for each of the three frames, but also can provide very high quantum efficiency (QE) across the visible spectrum. Also, since there is no subtraction needed, as there is in some rapid-sequence methods, the final signal-to-noise ratios can be much larger. With this method there is no need for readout between exposures and the time required for shifting charge at the end of one exposure and before the clock voltages are in correct relationship for the start of the next exposure, can be of the order of tens of microseconds.

In order to achieve high charge transfer efficiency (CTE) in a semiconductor structure having p-wells such as in this embodiment, it is desirable to have narrow gates and deep depletion regions so as to achieve relatively large fringing fields. Large fringing fields are desirable to round out the potential wells rather than permitting flat portions that may trap some charge. This phenomenon may be better understood with reference to FIGS. 5a–5d, which show a series of potential diagrams illustrating how fringing fields can eliminate charge trapping at the back portion of a CCD well caused by a p-well. FIG. 5a illustrates the existence of a flat potential portion in a semiconductor with no p-well and small fringing fields. The dashed line indicates that the threshold voltage is constant along the CCD channel and the clock voltages on the three gate electrodes in a set 1, 2, and 3, with 1 being +, 2 being −, and 3 being in transition from + to −. FIG. 5b shows the change in the profile of FIG. 5a due to the presence of large fringing fields wherein the flat portion at electrode 3 becomes rounded or inclined facilitating the collection of all the charge packets at the positive electrode 1. FIG. 5c illustrates the profile where it is desired to transfer charge into a p-well and where the fringing fields are small. The dashed line here shows that the threshold voltage increases where the charge packets move into the p-well. It will be seen that an amount of charge may become trapped at the flat portion at electrode 3, decreasing the amount of charge collected at electrode 1 and thus decreasing the transfer efficiency. In FIG. 5d, as in FIG. 5b, with large fringing fields, the profile becomes inclined at electrode 3 causing all of the charge packet to be transferred and collected at electrode 1. The clock amplitudes also may have to be higher than would otherwise be needed, but the necessary conditions can be met in the invention as herein described.

While a variety of CCD vertical clocking schemes for driving the gate electrodes 310 may be found appropriate for use with this embodiment, in accordance with the invention a 7-phase ripple clocking system (which may be regarded as an extension of 3-phase clocking in a way that is analogous to 8-phase ripple being an extension of 2-phase clocking) is preferred. Such a 7-phase ripple system can manage three charge packets with each set of seven gate electrodes as briefly described above. More particularly, as seen in FIG. 3, two gates 310 are disposed at each charge-packet-forming region 307, and two gates are disposed at each of the two shielded charge-packet-holding regions 309, with the seventh or last gate being used for reading out the successive charge packets. An alternative to 7-phase ripple is 4-phase ripple where each phase has, by design, its own well and barrier. However, 7-phase ripple is preferred because with it the device can store more charge per unit area. As contrasted with 7-phase ripple, in a conventional 3φ design, 9 phases are required to control 3 charge packets, making the 3φ design of a unit cell more complex.

FIGS. 6a–6n illustrate a detailed example of the manipulation of collected charge using 7-phase ripple clocking in the manner of the invention to capture an image using rapid sequential exposure. Referring, for convenience of description, to both the individual gate electrodes 310 and their bias voltages by their vertical phase identifications, $\phi_{V1}-\phi_{V7}$, it will be seen that the potential profile along the CCD channel 301 is shown in the Figures in terms of potential wells with charge packets (indicated by crosshatching) appropriately contained therein. By convention in such diagrams, the potential increases downwardly so that "going high" (a relatively positive applied clock voltage, +V) is indicated by the potential profile line going downward in the Figure, and "going low" (a relatively negative applied clock voltage, −V) is indicated by the potential profile line going upward. One set of seven gate electrodes for a single pixel is shown along with three electrodes for an adjoining pixel, but it will be understood that the operating pattern described will apply to the electrodes for all of the pixels in an image frame that has been detected. The electrode clocking moves the charge up and down in the potential diagram and forward over the potential barriers.

Initially, as seen in FIG. 6a, at $t_0$, following the first exposure, clock line $\phi_{V1}$ is low and the remaining lines, $\phi_{V2}-\phi_{V7}$, are high, so that charge carriers resulting from the exposure are contained in the CCD surface 304 under the gates $\phi_{V2}$ and $\phi_{V3}$, in the charge-packet-forming region 307, and under gates $\phi_{V4}-\phi_{V7}$ in the shielded charge-packet-holding regions 309. This charge is then shifted by first lowering the $\phi_{V2}$ potential (FIG. 6b), and then lowering the $\phi_{V3}-\phi_{V6}$ potentials (FIG. 6c) sequentially, so as to position the charge in a packet 350 in the charge-packet-holding region under gate electrode $\phi_{V7}$. Before the second exposure, the gates $\phi_{V2}-\phi_{V5}$ go high so that the resulting charge carriers are contained in the CCD surface 304 under gate electrodes $\phi_{V2}-\phi_{V5}$ (FIG. 6d). This charge is then shifted by first lowering $\phi_{V2}$ (FIG. 6e), and then lowering $\phi_{V3}$ and $\phi_{V4}$ (FIG. 6f) sequentially, so as to position a second charge packet 352 in a charge-packet-holding region under gate electrode $\phi_{V5}$. Preparatory to the third exposure, the gates $\phi_{V2}$ and $\phi_{V3}$ go high so that the resulting charge carriers are contained in the CCD surface 310 under these gate electrodes $\phi_{V2}$, $\phi_{V3}$ (FIG. 6g). This charge is then collected into a packet 354 under electrode $\phi_{V3}$ by lowering $\phi_{V2}$ (FIG. 6h), whereupon the charge packets resulting from the first, second, and third exposures are now stored respectively in charge-packet-holding regions at gate electrodes $\phi_{V7}$, $\phi_{V5}$, and $\phi_{V3}$.

With the charge packets stored in the configuration shown in FIG. 6h, the ripple clock readout may be begun. Firstly, $\phi_{V1}$ goes high causing the packet 350 at $\phi_{V7}$ to be distributed under $\phi_{V7}$ and $\phi_{V1}$ (FIG. 6i). Then, $\phi_{V7}$ goes low accumulating the charge of packet 350 at $\phi_{V1}$, so that the packet has effectively been moved from under $\phi_{V7}$ to under $\phi_{V1}$ (FIG. 6j). The charge packet 352 at $\phi_{V5}$ is then moved under $\phi_{V6}$, by successively causing gate electrode $\phi_{V6}$ to go high and gate electrode $\phi_{V5}$ to go low (FIGS. 6k and 6l, and packet 354 is similarly moved from under $\phi_{V3}$ to under $\phi_{V4}$, by causing $\phi_{V4}$ to go high and then $\phi_{V3}$ to go low (FIGS. 6m and 6n). One sub-cycle of ripple-clock readout has thus been ended with the charge packets 350, 352, and 354 disposed in charge-packet-holding regions 309 at gate electrodes $\phi_{V1}$, $\phi V_6$, and $\phi_{V4}$ as shown in FIG. 6n.

The charge packets may be moved accordingly in successive sub-cycles and scanned to a charge-sense amplifier to generate a voltage output signal indicative of the sizes of the charge packets from the three frames, the rows of charge packets being interleaved in line-sequential arrangement.

It will accordingly be seen that this invention provides a CCD device with a very-high-resolution array suitable for both monochrome and color imaging. The device may be used with an electrically switchable color filter. If this color filter is fast enough, the speed limitation could be simply the integration time needed to get a satisfactory signal-to-noise ratio. Without the switchable color filter, the device may be operated as a monochrome image sensor. Since the quantum efficiency and fill-factor are each so high, this could be a nearly ideal device.

While the preferred embodiment involves three-color imaging, this sensor device may be readily adapted to detecting more than three-color images by increasing the number of shielded charge-packet-holding regions and suitably modifying the gate arrangement and driving voltages. It may also be readily used in this manner as a monochrome imager.

What is claimed is:

1. A CCD sensor system capable of electronically producing a multi-color image comprising:

a photosensitive surface for producing photoelectrons in response to the impinging of light from an image;

a CCD structure on a surface opposite said photosensitive surface;

a relatively wide depletion layer separating said photosensitive surface from said CCD structure;

means, formed in said depletion layer, for producing a potential profile comprising an array of potential wells that shield portions of said CCD structure from said photoelectrons to create shielded charge-packet-holding regions in said CCD structure, and that cause said photoelectrons to converge into selected portions of said CCD structure to create charge-packet-forming regions in said CCD structure, with each of said charge-packet-forming regions being disposed adjacent associated shielded charge-packet-holding regions;

gate electrode means, disposed on said CCD structure, for controlling the shifting of charge packets from said charge-packet-forming regions to and within said associated shielded charge-packet-holding regions, whereby light of successive frames of said image in different colors can be selectively sensed electronically and stored for readout as a color image, said gate electrode means comprising means for successively shifting charge packets from said charge-packet-forming regions to said associated shielded charge-packet-holding regions upon receipt of the light from successive image frames, whereby a multi-color image may be electronically sensed and produced.

2. The sensor system of claim 1 further comprising an anti-reflective coating disposed on said photosensitive surface.

3. The sensor system of claim 1 wherein said gate electrode means further comprises cooperating sets of electrodes, with at least one electrode of a set disposed opposite a charge-packet-forming region, and at least another electrode of a set disposed opposite a shielded charge-packet-holding region.

4. The sensor system of claim 3 wherein said gate electrode means further comprises:

means for applying high and low voltages to each said set of electrodes, and controlling the applying of said voltages to successively shift the charge packets produced by successive image frames from the charge-packet-producing regions to charge-packet-holding regions; and means for applying ripple-clock high and low voltages to each said set of electrodes, and controlling the applying of said ripple-clock voltages to successively shift the charge packets in charge-packet-producing and charge-packet-holding regions such that all of said charge packets are disposed in charge-packet-holding regions.

5. The sensor system of claim 1 wherein each of said charge-packet-forming regions has two associated charge-packet-holding regions into which the charge packets from the charge-packet-forming region are successively shifted upon receipt of the light from successive image frames, whereby a three-color image may be electronically sensed and produced.

6. The sensor system of claim 5 wherein said gate electrode means comprises sets of seven electrodes, each set having a first and a second electrode disposed opposite a charge-packet-forming region, a third and a fourth electrode disposed opposite one of said two charge-packet-holding regions, a fifth and a sixth electrode disposed opposite the other of said two charge-packet-holding regions, and with a seventh electrode at the end of each set opposite a charge-packet-holding region.

7. The sensor system of claim 6 wherein said gate electrode means further comprises:

means for applying high and low voltages to said sets of seven electrodes; and means for controlling said voltage applying means to successively shift the charge packets produced by successive image frames to respective locations within said CCD structure, said locations for each set of seven electrodes being opposite said sixth electrode, an electrode opposite a charge-packet-holding region, and an electrode opposite a charge-packet-forming region.

8. The sensor system of claim 7 wherein said gate electrode means further comprises:

means for applying ripple-clock high and low voltages to said sets of seven electrodes, when said charge packets produced by successive image frames are respectively located within said CCD structure at locations for each set of seven electrodes opposite said sixth electrode, an electrode opposite a charge-packet-holding region, and an electrode opposite said charge-packet-forming region; and means for controlling said ripple-clock voltage applying means to successively shift the charge packets produced by successive image frames from said respective locations to respective locations within said CCD structure opposite said seventh electrode, said fifth electrode, and said third electrode, of each set of seven electrodes, whereby all of said charge packets are disposed within a charge-packet-holding region.

9. The sensor system of claim 1 further comprising:

a charge-sense amplifier; and readout means for reading out charge packets stored in said charge-packet-holding regions, said readout means comprising means for scanning all of the charge packets to said charge-sense amplifier to generate a voltage output signal indicative of the sizes of the charge packets of the three frames.

10. The sensor system of claim 9 wherein said readout means further comprises:

a series of vertical CCD registers; and a horizontal CCD register, coupled to said series of vertical CCD registers and said charge-sense amplifier, for receiving said charge packets from said vertical CCD registers and providing an output indicative thereof to said charge-sense amplifier; and further comprising:

shutter means for controlling the passage of light from a color image along an optical path to said photosensitive surface; and means, sequentially operating in said optical path, for successively passing frames of said image, each composed of light of a different color, onto said photosensitive surface.

11. A method for electronically producing a multi-color image comprising the steps of:

providing a photosensitive surface that produces photoelectrons in response to the impinging of light from an image;

disposing a CCD structure on a surface opposite said photosensitive surface;

disposing a relatively wide depletion layer between said photosensitive surface and said CCD structure;

producing, in said depletion layer, an array of potential wells forming a potential profile that shields portions of said CCD structure from said photoelectrons, to create charge-packet-holding regions in said CCD structure, and that causes said photoelectrons to converge into selected portions of said CCD structure in regions between said potential wells and each adjacent a charge-packet holding region, to create charge-packet-forming regions in said CCD structure, each with an associated charge-packet-holding region; and disposing a series of gate electrodes on said CCD structure and applying clock voltages thereto, for controlling the shifting of charge packets successively from said charge-packet-forming regions to and within said associated charge-packet-holding regions, whereby light of successive frames of said image in different colors can be selectively sensed electronically and stored for readout as a color image.

12. The method of claim 11 further comprising the step of:

forming said potential profile such that each of said charge-packet-forming regions has at least one associated charge-packet-holding region into which the charge packets from the charge-packet-forming region can be shifted prior to the receipt of the light from a successive image frame.

13. The method of claim 12 further comprising the step of:

arranging said series of gate electrode means into cooperating sets of electrodes, with at least one electrode of a set disposed opposite a charge-packet-forming region, and at least another electrode of a set disposed opposite a charge-packet-holding region.

14. The method of claim 13 comprising the further steps of:

applying high and low voltages to each said set of electrodes, and controlling the applying of said voltages to successively shift the charge packets produced by successive image frames from the charge-packet-producing regions to charge-packet-holding regions; and applying ripple-clock high and low voltages to each said set of electrodes, and controlling the applying of said ripple-clock voltages to successively shift the charge packets in charge-packet-producing and charge-packet-holding regions such that all of said charge packets are disposed in charge-packet-holding regions.

15. The method of claim 11 wherein said charge-packet-forming regions and said charge-packet-holding regions are arranged in rows and comprising the further step of:

scanning all of the charge packets to a charge-sense amplifier that generates a voltage output signal corresponding to the sizes of the charge packets from the successive image frames, the rows of charge packets being interleaved in line-sequential arrangement.

16. The method of claim 11 further comprising the step of:

forming an anti-reflective coating on said photosensitive surface.

17. A method for electronically producing a color image using a CCD sensor, comprising the steps of:

providing a shutter to control the passage of light from a color image along an optical path to said CCD sensor;

sequentially operating a filter in said optical path to successively pass frames of said image, each composed of light of a different color, onto a photosensitive surface of said CCD sensor;

disposing a plurality of potential barriers in said CCD sensor between said photosensitive surface and a CCD structure on an opposite surface;

opening said shutter to pass light from said color image onto said photosensitive surface;

producing charge packets in charge-packet-forming regions of said CCD structure between said potential barriers in response to the receipt of a first frame of light of said image, said first frame light being of one color passed by said filter;

collecting said charge packets produced by said first light frame and shifting said charge packets into charge-packet-holding regions of said CCD structure shielded by said potential barriers;

producing charge packets in said charge-packet-forming regions of said CCD structure in response to the receipt of a second frame of light of said image, said second frame light being of a different color from that of said first frame light;

collecting said charge packets produced by said second frame light and shifting said charge packets into charge-packet-holding regions of said CCD structure shielded by said potential barriers;

producing charge packets in said charge-packet-forming-regions of said CCD structure in response to the receipt of a third frame of light of said image, said third frame light being of a different color from that of said first and second frame light; and closing said shutter and scanning all of the charge packets to a charge-sense amplifier to generate a voltage output signal indicative of the sizes of the charge packets of the three frames; and wherein said step of disposing said potential barriers comprises forming each of said charge-packet-forming regions with two adjacent charge-packet-holding regions into which the charge packets from the charge-packet-forming region are successively shifted upon receipt of the light from successive image frames.

18. The method of claim 17 further comprising the step of:

operating said shutter in conjunction with a three-color sequential filter disposed in the optical path of said image.

19. The method of claim 18 comprising the further step of:

providing sets of seven gate electrodes, with a first and a second electrode disposed opposite each of said charge-packet-forming regions, a third and a fourth electrode disposed opposite one of said two adjacent charge-packet-holding regions, a fifth and a sixth electrode disposed opposite the other of said two adjacent charge-packet-holding regions, and with a seventh electrode at the end of each set opposite a charge-packet-holding region.

20. The method of claim 19 comprising the further steps of:

applying high and low voltages to said sets of seven electrodes; and controlling the applying of said voltages to successively shift the charge packets produced by successive image frames to respective locations within said CCD structure, said locations for each set of seven electrodes being opposite said sixth electrode, an electrode opposite a charge-packet-holding region, and an electrode opposite a charge-packet-forming region.

21. The method of claim 20 further comprising the steps of:

applying ripple-clock high and low voltages to said sets of seven electrodes, when said charge packets produced by successive image frames are respectively located within said CCD structure at locations for each set of seven electrodes opposite said sixth electrode, an electrode opposite a charge-packet-holding region, and an electrode opposite a charge-packet-forming region; and controlling the applying of said ripple-clock voltages to successively shift the charge packets produced by successive image frames from said respective locations to respective locations within said CCD structure opposite said seventh electrode, said fifth electrode, and said third electrode, of each set of seven electrodes, whereby all of said charge packets are disposed in charge-packet-holding regions.

22. The method of claim 17 wherein said charge-packet-forming regions and said charge-packet-holding regions are arranged in rows and said step of scanning all of the charge packets comprises:

scanning all the collected charge packets, via one CCD output region, to said charge-sense amplifier and interleaving the rows of charge packets in line-sequential arrangement.

* * * * *